US009023165B2

(12) United States Patent
Brown et al.

(10) Patent No.: US 9,023,165 B2
(45) Date of Patent: May 5, 2015

(54) FIBROUS NETWORKS AND A METHOD AND APPARATUS FOR CONTINUOUS OR BATCH FIBROUS NETWORK PRODUCTION

(75) Inventors: David P. Brown, Helsinki (FI); Andrei Ollikainen, Helsinki (FI); Esko I. Kauppinen, Helsinki (FI); Albert G. Nasibulin, Espoo (FI); Jussi Heikkonen, Helsinki (FI)

(73) Assignee: Canatu Oy, Helsinki (FI)

( * ) Notice: Subject to any disclaimer, the term of this patent is extended or adjusted under 35 U.S.C. 154(b) by 1502 days.

(21) Appl. No.: 12/999,829
(22) PCT Filed: Jun. 23, 2008
(86) PCT No.: PCT/FI2008/050383
  § 371 (c)(1),
  (2), (4) Date: May 9, 2011
(87) PCT Pub. No.: WO2009/000969
  PCT Pub. Date: Dec. 31, 2008

(65) Prior Publication Data
  US 2011/0212308 A1    Sep. 1, 2011

(30) Foreign Application Priority Data
  Jun. 25, 2007  (FI) ..................................... 20075482

(51) Int. Cl.
  *B44C 1/165*  (2006.01)
  *C01B 31/02*  (2006.01)
  (Continued)

(52) U.S. Cl.
  CPC ......... *B81C 1/00357* (2013.01); *C01P 2004/13* (2013.01); *C01P 2004/16* (2013.01);
  (Continued)

(58) Field of Classification Search
  CPC .............. C01B 31/0206; C01B 31/022; C01B 31/0226; C01B 31/0253; C01B 2202/00; C01B 2202/02; C01B 2202/22; C01P 2004/13; C01P 2004/133; C01P 2004/16; C01P 2004/17; B32B 37/04

USPC ........................ 428/195.1; 156/230, 236, 232
See application file for complete search history.

(56) References Cited

U.S. PATENT DOCUMENTS 6,866,801 B1 *  3/2005  Mau et al. ..................... 264/29.1
6,887,450 B2 *  5/2005  Chen et al. ................ 423/445 R
(Continued)

FOREIGN PATENT DOCUMENTS

EP    1630128 A1    3/2006
EP    1652573 A1    5/2006
(Continued)

OTHER PUBLICATIONS

Nikolaev et al. "Gas Phase Catalytic Growth of Single-walled Carbon Nanotubes from Carbon Monoxide", Chem. Phys. Lett., 1999, vol. 313, p. 91-97.*

(Continued)

*Primary Examiner* — Gerard Higgins
(74) *Attorney, Agent, or Firm* — Young & Thompson (57) ABSTRACT

A method for the production of a fibrous network-substrate component includes the steps of providing a network of fibrous material (1) on a preliminary substrate (2) by filtering high aspect ratio molecular structures (HARM-structures) from gas flow, placing the network of fibrous material (1) on the preliminary substrate (2) in proximity to a secondary substrate (3), applying a force to the network of fibrous material (1) to preferably attract the network of fibrous material (1) from the preliminary substrate (2) to the secondary substrate (3) in order to transfer the network of fibrous material (1) from the preliminary substrate (2) to the secondary substrate (3), and removing the preliminary substrate (2) from the network of fibrous material (1).

19 Claims, 9 Drawing Sheets

(51) Int. Cl.
  B81C 1/00    (2006.01)
  C04B 14/02   (2006.01)
  C04B 30/02   (2006.01)
  C04B 111/00  (2006.01)

(52) U.S. Cl.
  CPC ......... C01B31/0206 (2013.01); C01B 31/0253 (2013.01); B81C 1/00373 (2013.01); B81C 1/00476 (2013.01); B81C 2001/00452 (2013.01); B81C 2201/0187 (2013.01); B81C 2201/0188 (2013.01); B81C 2201/0194 (2013.01); C04B 14/026 (2013.01); C04B 30/02 (2013.01); C04B 2111/00844 (2013.01); C04B 2111/00853 (2013.01)

(56) References Cited

U.S. PATENT DOCUMENTS

| 2002/0172639 | A1 | 11/2002 | Horiuchi et al. |
| 2006/0188721 | A1 | 8/2006 | Irvin, Jr. et al. |
| 2006/0207931 | A1 | 9/2006 | Liang et al. |
| 2007/0141345 | A1 | 6/2007 | Rinzler et al. |
| 2007/0298253 | A1 | 12/2007 | Hata et al. |

FOREIGN PATENT DOCUMENTS

| JP | 2005097003 A | 4/2005 |
| WO | 0073204 A1 | 12/2000 |
| WO | 2006030981 A1 | 3/2006 |
| WO | 2006048015 A1 | 5/2006 |
| WO | 2006099156 A2 | 9/2006 |
| WO | 2007022226 A2 | 2/2007 |
| WO | 2007035838 A2 | 3/2007 |
| WO | 2007055744 A2 | 5/2007 |

OTHER PUBLICATIONS

Finnish Search Report, dated Feb. 2, 2007, from corresponding Finnish application.
International Search Report, dated Oct. 8, 2008, from corresponding PCT application.
Nasibulin, et al., "Integration of Single-Walled Carbon Nanotubes into Polymer Films by Thermo-Compression", Chemical Engineering Journal 136, pp. 409-413 (2008).

* cited by examiner

FIBROUS NETWORKS AND A METHOD AND APPARATUS FOR CONTINUOUS OR BATCH FIBROUS NETWORK PRODUCTION

FIELD OF THE INVENTION

The present invention relates to fibrous network-substrate components and a method and apparatus for their production. Especially the present invention relates to a method in which a patterned or homogeneous deposit of a fibrous network is transferred from a preliminary to a secondary substrate by the application of a force. The present invention further relates to structures and devices fabricated by the same.

BACKGROUND OF THE INVENTION

Examples of HARM-structures include nanotubes (NTs) for example carbon nanotubes (CNTs), fullerene functionalized carbon nanotubes (FFCNTs), carbon nanobuds (CNBs), boron-nitride NTs (BNNTs), nanorods including carbon, phosphorous, boron, nitrogen and silicon containing nanorods, filaments and other tubular, rod, or ribbon or otherwise fibrous or high aspect ratio molecular structures (HARM-structures). HARM-structures are of great interest due to their unique and useful physical and chemical properties. For example, CNT based components have wide ranging applications including light-emitting diodes, transistors, filters, field emitters, photovoltaic devices and fuel cells.

Ideally, even an individual HARM-structure with a well defined property and in a specific location is sufficient for many applications. However, to date, manufacturing of structures based on individual HARM-structures has been too difficult, time-consuming and expensive to be commercially viable.

Consequently, for many purposes, thin films, sparse or dense networks or mats (heretofore referred to as networks) of HARM-structures are preferable, since networks can be easier to manipulate, assemble and integrate than individuals. The high conductivity of certain HARM-structures, such as metallic carbon nanotubes and carbon nanobuds, together with their extremely high aspect ratios allows for efficient electrical percolation, even in randomly oriented surface deposited mats or films. Networks of semi-conducting HARM-structures are useful, for instance, as the conductive channel of a transistor. Sparse networks or a mixture of metallic and semi-conducting HARM-structures can also be used as the conductive channel if the concentration of HARM-structures is sufficiently low so that there are no metallic pathways between the source and drain.

Random network CNT based devices have been already successfully used as gas detectors, transparent conductive coatings and field emitters. Also, they are considered to be strong candidates for ITO replacement in transparent electrodes where the high costs of raw materials and production processes together with performance barriers related to brittleness and coloring are limiting their commercial lifetime.

Networks of CNT HARM-structures in polymer structures allow for the creation of flexible and transparent electronic devices. However, polymers cannot be used directly as growth substrates for, for example, carbon nanotubes due to the high temperatures often required for their synthesis. Therefore, several methods, such as dry printing and electrical or thermal precipitation have been proposed for transferring onto plastics.

Networks of CNT HARM-structures have previously been produced using e.g. filtration from a liquid, by depositing from a solution via spray coating or spin drying. Carbon nanotubes can also be suspended in solution and sprayed or spin coated onto e.g. silicon wafers, however, such techniques require additional processing steps and equipment.

Problems with prior art methods are the difficulty in patterning, the need to deposit on a desired substrate immediately, the need to put in solution and thus disperse, sonicate and functionalize HARM-structures before use, all of which can degrade the product and lead to complex and expensive manufacturing processes.

PURPOSE OF THE INVENTION

A purpose of the present invention is to reduce the aforementioned technical problems of the prior-art by providing a simple method for easily and efficiently transferring networks of fibrous materials such as HARM-structures with adjustable thicknesses, transparency and/or conductivity to polymer and other useful substrates. An additional purpose of the present invention is to provide an apparatus for the simple transferring networks of fibrous materials such as HARM-structures with adjustable thicknesses, transparency and/or conductivity to polymer substrates and other useful substrates. An additional purpose of the present invention is to provide components and devices containing networks of fibrous materials such as HARM-structures.

SUMMARY OF THE INVENTION

The method for the production of a fibrous network-substrate component comprises the following steps:

a) providing a network of fibrous material on a preliminary substrate by depositing high aspect ratio molecular structures (HARM-structures) from gas flow onto the preliminary substrate;

b) placing the network of fibrous material on the preliminary substrate in proximity to a secondary substrate;

c) applying a force to the network of fibrous material to preferably attract the network of fibrous material from the preliminary substrate to the secondary substrate in order to transfer the network of fibrous material from the preliminary substrate to the secondary substrate; and d) removing the preliminary substrate from the network of fibrous material.

The network of fibrous material on the preliminary substrate can in step b) be placed in close proximity to the secondary substrate.

By a fibrous network-substrate component is meant a component of, for example a device, having, as all or part of its structure, a patterned or homogeneous layer of HARM-structures deposited on or incorporated into a substrate.

By a network is meant, for example, a layer, a film, a mat, a sparse or dense random or oriented or homogeneous or patterned network and/or any other simfilar structure. By a network of fibrous material is meant any of above structures comprising one or more high aspect ratio (fibrous) molecular structures (HARM-structures). Preferably said network of fibrous material comprises a multitude of HARM-structures.

The term HARM-structure (high aspect ratio (fibrous) molecular structure) is meant to include, but not be limited to, a nanotube, a carbon nanotube, a fullerene functionalized carbon nanotube, a nanobud, a boron-nitride nanotube, a nanorod including carbon, phosphorous, boron, nitrogen and/or silicon containing nanorod, a filament and/or any other tube, tubular, rod and/or ribbon and/or any other high aspect ratio molecular structure.

By a substrate is meant any desired substrate, which is suitable for a specific application. Examples of suitable substrates are numerous. A condition of the substrate is that the fibrous network must be preferably attracted to the secondary substrate either directly and/or by some pre or post conditioning process as described. The network of fibrous material can be attracted to the secondary substrate by aid of a matrix, intercalation or suspension material surrounding the fibrous network.

A preliminary substrate can comprise, as an example only, nitrocellulose, polyvinylidene fluoride (PVDF), polyethylene (PE), polytetrafluoroethylene (Teflon), glass fiber, and/or silver. In accordance with the present invention, a collection filter can also act as a preliminary substrate. A secondary substrate can comprise, as an example only, glass, silicon and/or PE. Other materials are possible according to the invention and the above list is not meant to limit the scope of the invention in any way.

In one embodiment of the invention the method comprises the step of filtering the high aspect ratio molecular structures (HARM-structures) from gas flow. Deposition of the fibrous material on the preliminary substrate can be performed, for example, by magnetic, mechanical, thermophoretic, photophoretic, electrophoretic, gravitational and/or inertial transport. Other mechanisms are also possible according to the invention. The fibrous material on the preliminary substrate can be prepared, and in that way obtained, as a part of the method according to the present invention. A suitable fibrous material on the preliminary substrate can be chosen for a specific application and used in the method according to the present invention.

Preparing the network of fibrous material on the preliminary substrate can include modifying the network of fibrous material and/or the preliminary substrate. The network to be transferred and/or the transferred network can be modified. The modification can be done by physical compression, the application and/or removal of heat and/or energy, the application of a matrix, intercalation, suspension, adhesive and/or junction creating material, the application of functionalizing material and/or application of a force field. The network can be modified to, for instance, increase the conductivity, change the mechanical properties, transparency, conductivity, stiffness and/or optical transmissivity at different wavelengths so as to, for instance, alter the color of the film.

The fibrous network can be conditioned and/or modified so as to facilitate the transfer process, though this is not a requirement according to the invention. The purpose of the conditioning and/or modification is to, for example, strengthen the network so that it is more rigid in preparation for the transfer, to condition the network so that a force may act upon it (e.g. by deposition of magnetic particles before introducing into an electric field), to reduce the adhesion force of the network to the preliminary substrate, to increase the adhesion force to the secondary substrate. The conditioning may also result in densification of the network which may increase the number and/or quality of interconnects between the fibrous elements to, for example, vary the mechanical, electrical and/or optical properties of the networks. In the case of carbon nanotubes and carbon nanobuds, increasing the number and/or quantity of interconnects can serve to increase the conductivity of the network for a given transparency or to increase the transparency for a given conductivity. Similarly, such interconnects can be used to increase the strength of a composite material containing HARMs and, for instance, a polymer matrix.

Conditioning and/or modifying the network may be done by means of e.g. chemical reaction, vapor and/or particle deposition, compression and/or densification by, for example, physical compression, the application and/or removal of heat and/or energy, the application of a matrix, intercalation, suspension, adhesive and/or junction creating material, bombardment by, for example, particles, ions or electrons and/or application of a force, sputtering of, for example gold, platinum, cobalt, nickel, copper or some other conductive material, burning off conductive or nonconductive elements of the network by, for instance, high current or chemical etching, precipitation of a functionalizing or otherwise conditioning material from solution or direct condensation or nucleation followed by aerosol deposition from the gas phase onto the network. One example of a method for conditioning the deposit to improve the interconnects between the fibrous elements in the network is to functionalize the fullerene-like portion of a nanobud molecule with a bridging molecule, such as a hydroxyl group to bind to a fullerene-like group of a neighboring nanobud molecule.

In one embodiment of the present invention the method further comprises applying a coating and/or a laminate to the exposed surface of the transferred mat.

A force can be applied to the network of fibrous material on a preliminary substrate. The force applied to the network in order to preferably attract the network from the preliminary substrate to the secondary substrate is in one embodiment of the invention provided by (due to) a differential in adhesive forces between the network of fibrous material and the preliminary substrate and the network of fibrous material and the secondary substrate.

The differential in adhesive forces between the network of fibrous material and the preliminary substrate and the network of the fibrous material and the secondary substrate is in one embodiment of the invention in whole or in part provided by (due to) a differential in electrical, electrostatic, van der Waals, magnetic, and/or capillary forces and/or by (due to) a differential in surface tension. Other forces or combinations thereof are also possible according to the invention.

The differential in adhesive force between the network of fibrous material and the preliminary substrate and the network of fibrous material and the secondary substrate is in one embodiment of the invention in whole or in part provided by using a matrix, an intercalation or a suspension material, which is in contact with the network of fibrous material on the preliminary substrate, and which is preferably attracted to the secondary substrate and thus transports the network of fibrous material together with the matrix, intercalation or suspension material from the preliminary substrate to the secondary substrate.

The differential in adhesive force between the network of fibrous material and the preliminary substrate and the network of fibrous material and the secondary substrate is in one embodiment of the invention in whole or in part provided by applying and/or removing heat and/or energy to and/or from one or more of the network of fibrous material, the preliminary substrate and the secondary substrate so that the network of fibrous material is preferably attracted to the secondary substrate.

In one embodiment of the present invention the method comprises the step of modifying the network of fibrous material by physical compression, by the application and/or removal of heat and/or energy, by the application of a matrix, intercalation, suspension, adhesive and/or junction creating material and/or by application of a force field. In one embodiment of the invention the junction creating material is a metal particle.

In one embodiment of the invention, the junction creating material is a linking molecule, e.g. a polymer, which bonds to two or more HARMS, or which bonds one or more HARMS to a matrix material.

In one embodiment of the invention, the applied matrix, intercalation or suspension material is a liquid or a solid heated above its glass transition temperature. The substrate material can also serve as the matrix, intercalation, suspension, adhesive and/or junction creating material by heating the substrate beyond its glass transition temperature for a period of time. In this case heating the substrate above the glass transition temperature transforms the substrate material also into a matrix, intercalation, suspension, adhesive and/or junction creating material.

The applied matrix, intercalation or suspension material can be a liquid. In one embodiment of the invention the liquid is water, an alcohol, ketone and/or acetone. In one embodiment of the invention the liquid is fully or partially evaporated.

The force can be applied to the network by, for example, viscous drag, mechanical pressure and/or bombardment by particles, inertia (via, for example, centrifuging) and/or electrical and/or magnetic fields and/or any other means.

In one embodiment of the present invention the method comprises the step of applying heat and/or energy to the network of fibrous material, the preliminary substrate and/or the secondary substrate by laser, electrical, resistive, conductive, radiative (in the entire range of the electromagnetic spectrum) and/or acoustic and/or vibrational heating, inductive heating, combustion and/or chemical reaction, and/or nuclear reaction. In one embodiment of the invention the method comprises the step of removing heat and/or energy from the network of fibrous material, the preliminary substrate and/or the secondary substrate by electrical cooling, conductive cooling, radiative cooling and/or chemical reaction.

The modifying force field can be thermophoretic, inertial, electrical, magnetic, photophoretic, acoustic and/or gravitational.

In one embodiment of the present invention any or all of steps (a) to (d) are performed intermittently for batch production of one or more fibrous network-substrate components. In one embodiment of the present invention the steps (a) to (d) are performed continuously for continuous production of one or more fibrous network-substrate components. The repeating of said steps can be performed in parallel and/or in series in order to form one or more multilayered fibrous network-substrate components. Moreover, by applying the transfer two or more times for the same secondary substrate, complex, for example, two or three dimensional patterns or structures can be provided.

The apparatus according to the present invention for the production of fibrous network-substrate components, comprises:

a) means for providing a network of fibrous material on a preliminary substrate by depositing high aspect ratio molecular structures (HARM-structures) from gas flow onto the preliminary substrate;

b) means for placing the network of fibrous material in close proximity to a secondary substrate;

c) means for applying a force to the network to preferentially attract the network to the secondary substrate from the preliminary substrate in order to transfer the network from the preliminary substrate to the secondary substrate; and d) means for removing the preliminary substrate from the network of fibrous material.

In one embodiment of the present invention the apparatus can further comprise means for modifying the transferred network.

In one embodiment of the present invention the apparatus can further comprise means for applying a coating or laminate to the exposed surface of the transferred network.

In one embodiment of the present invention the apparatus can further comprise means for forming a multilayered fibrous network-substrate component.

The fibrous network-substrate component according to the present invention is made in accordance with the method according to the present invention.

The fibrous network-substrate components according to the present invention are used in the production of a structure, component and/or device.

An advantage of the present invention is that it provides a simpler, cheaper and more versatile method than prior art techniques thus allowing reduced cost and better performance. The method in accordance with the present invention allows the preparation of networks of fibrous material of, for example, single-walled and multiwalled carbon nanotubes and carbon nanobuds, wherein said networks of fibrous material can have different thicknesses and can be easily integrated onto, for example, polymer films and electrical components.

When the HARM-structures are deposited onto the preliminary substrate directly from gas phase, by e.g. filtering from a gas-flow, the problem of limited dispersion encountered in liquid or solution based deposition is alleviated. Deposition from a gas-flow provides a way to eliminate the need to disperse HARM-structures in a liquid, and the need to sonicate and to functionalize HARM-structures before use.

The method according to the present invention is beneficial to both industry and commerce.

The invention is particularly useful in, for example, the manufacture of homogeneous or patterned transparent, conductive, semi-conductive, and flexible carbon nanotube coated polymer films and multi-layered or three-dimensional structures, which are suitable for many optical and electronic applications such as opaque or transparent electrodes, interconnects, transistors, memory elements, diodes, lasers, filters, optical absorbers, saturable absorbers, field emitters, photo receptors, logic gates, inverters and probes; electrochemical devices such as supercapacitors and hydrogen storage devices (e.g. in fuel cells); analytical applications such as gas sensors, CNTs as electrode materials and/or modifiers for analytical voltammetry, biosensors, chromatographic applications, mechanical applications such as conducting composites for antistatic shielding, transparent conductors, shielding of electromagnetic interference, electron guns for microscopes, field emission cathodes in, for instance, microwave amplifiers and/or field emission displays, supercapacitors, gas storage, field-effect transistors, electromechanical actuators, electrodes in lithium batteries, NT-based lamps, nanosensors, thin film polymeric solar cells, fuel cells, ultracapacitors and/or thermionic power supplies.

BRIEF DESCRIPTION OF THE DRAWING FIGURES

In the following section, the invention will be described in detail by means of exemplary embodiments with references to accompanying drawings, in which FIG. 8 presents SEM-images of randomly oriented SWCNT networks on filter disks; FIG. 9 presents TEM images of a sandwich structure having a mat of SWNTs in between layers of polyethene (PE); 9a shows a cross section of the entire three layer structure.

In the following descriptions of the invention the terms fibrous network and film are used interchangeably.

DETAILED DESCRIPTION OF THE INVENTION

Figure 1:
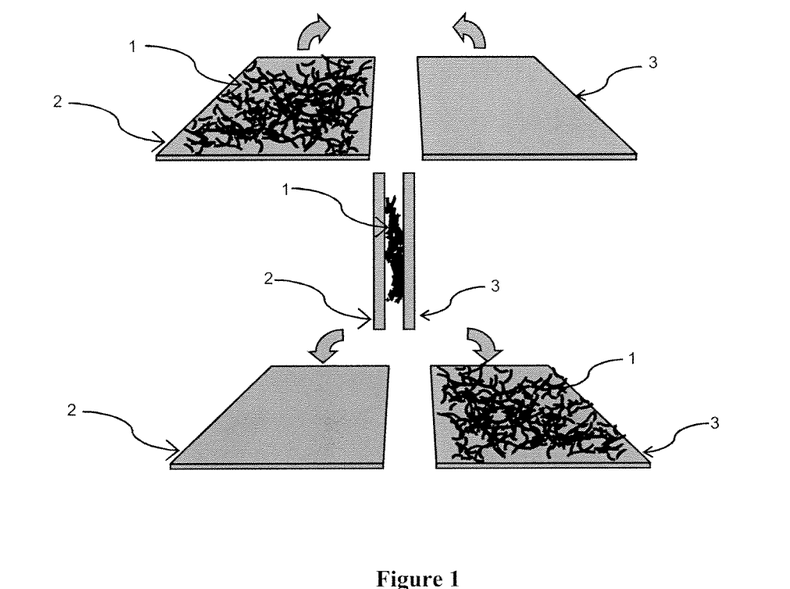
FIG. 1 shows a schematic diagram of the method according one embodiment the invention.

As illustrated in FIG. 1 the first step in the method according to one embodiment of the present invention is to obtain a fibrous network 1 on a suitable preliminary substrate 2, wherein the network contains a multitude of high aspect ratio (fibrous) molecular structures (HARM-structures). The preliminary substrate 2 is then placed in close proximity to a suitable secondary substrate 3. The initially obtained fibrous network 1 can be homogeneous or inhomogeneous. It can e.g. be patterned, aligned and/or oriented and/or be of varying thickness or composition.

Figure 2:
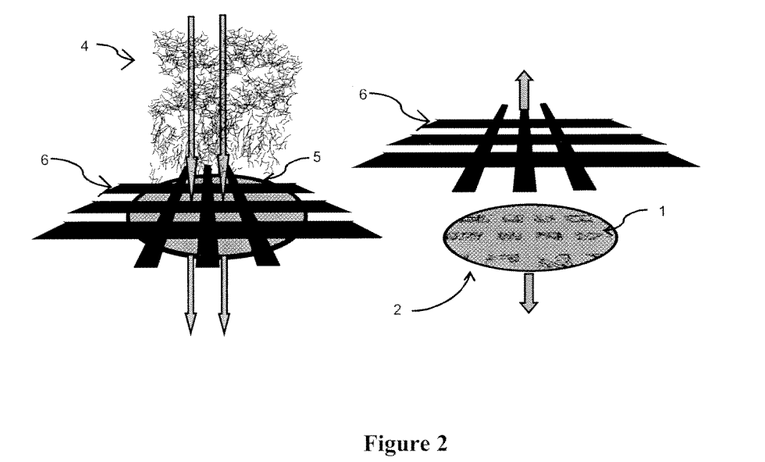
FIG. 2 shows a schematic diagram of a method for producing a patterned preliminary substrate, according to one embodiment of the invention.

FIG. 2 shows one embodiment of the method for obtaining a patterned fibrous network on a preliminary substrate 2, wherein a suspension of fibrous network material (HARM-structures) 4 is made to pass through a filter 5 overlaid with a pattern or grid 6 so as to obtain a patterned fibrous network 1 on a preliminary substrate 2.

Figure 3:
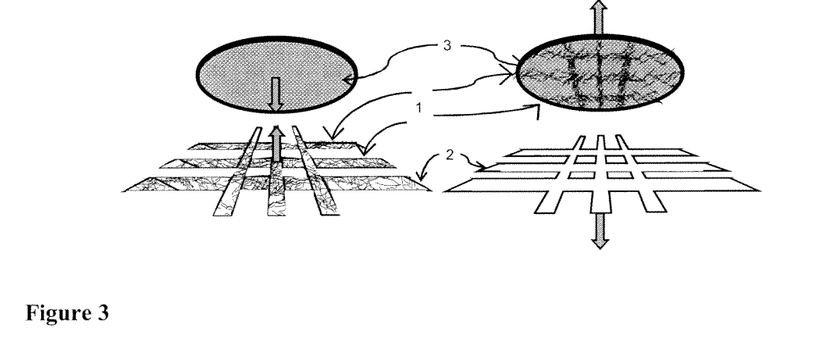
FIG. 3 shows a schematic diagram of a method for producing a patterned secondary substrate, according to one embodiment of the present invention.

FIG. 3 shows one example of achieving a patterning. The fibrous network or film 1 is obtained on a patterned preliminary substrate 2, placed in close proximity to a secondary substrate 3, whereupon the film is transferred.

Figure 4:
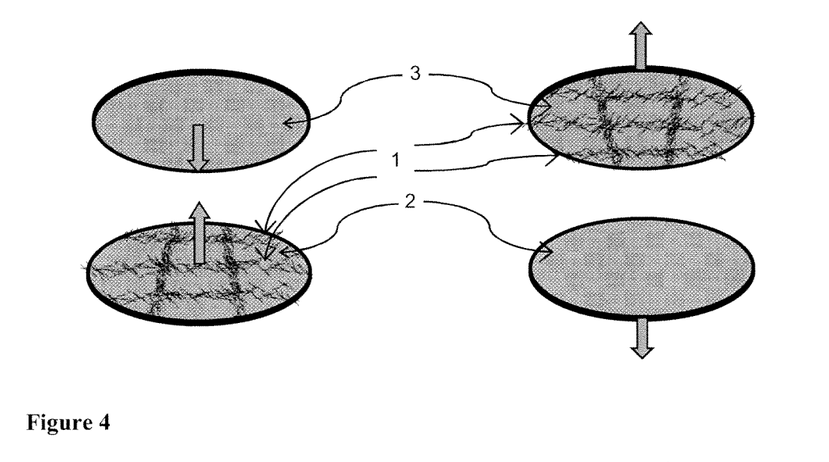
FIG. 4 shows a schematic diagram of a method for producing a patterned secondary substrate, according to one embodiment of the present invention.

In one embodiment of the invention, depicted in FIG. 4 a patterned deposit on the preliminary substrate 2, is obtained by a lift-off process. In this process an additive layer of a soluble or otherwise removable material (e.g. a polymer such as AZ) is deposited on the preliminary substrate 2. Then the soluble material is exposed to a patterned radiation of, for example, UV light (e.g. through a mask) and washed in a solvent (e.g. potassium or sodium hydroxyide) after exposure. The washing process removes the exposed portions of the additive layer. The HARM-structures are subsequently deposited on the remaining additive layer and the newly exposed portions of the preliminary substrate 2. When the surface is further washed in a solvent the remaining additive material is removed together with the HARM-structures deposited on it. This leaves behind a patterned deposit 1 of HARM-structures on the preliminary substrate 2 which is then transferred to the secondary substrate 3.

Figure 5:
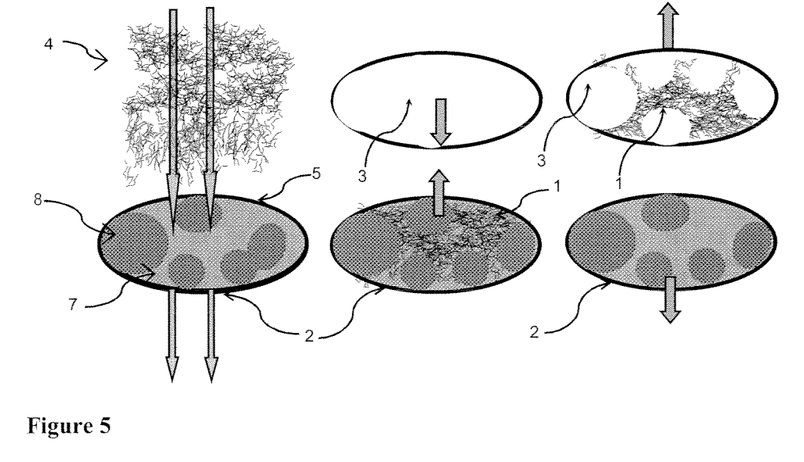
FIG. 5 shows a schematic diagram of a method for producing a patterned secondary substrate, according to one embodiment of the invention.

In another embodiment of the invention, depicted in FIG. 5 a patterned deposit on the preliminary substrate 2, is obtained by passing a suspension of fibrous network material (HARM-structures) through a filter 5 having an embedded pattern. The pattern may be realized in the filter 5, for instance, by having regions of relatively high 7 and relatively low 8 porosity so that the suspension preferentially passes through the high porosity region 7. The HARM-structures are thereby deposited according to the pattern resulting in a patterned fibrous network 1 on the preliminary substrate 2. This patterned fibrous network 1 can then be transferred to the secondary substrate 3.

Figure 6:
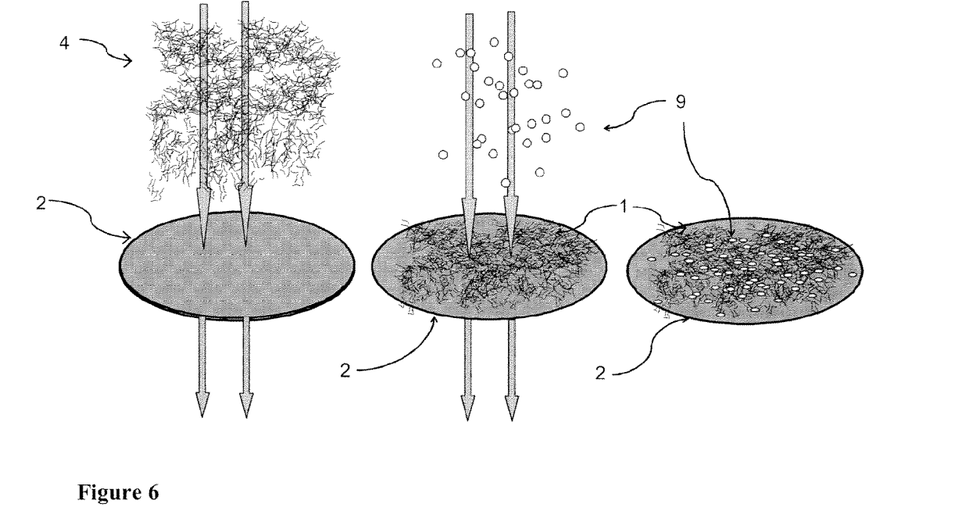
FIG. 6 shows a schematic diagram of a method for producing a preliminary substrate wherein the HARM network is modified by the co-deposition of particles, according to one embodiment of the invention.

In one embodiment of the invention, depicted in FIG. 6 the fibrous network or film 1 is modified on the preliminary substrate 2, by co-depositing particles 9 from a suspension on the substrate 2 before, during or after the CNT mat is deposited. In FIG. 6, filtration is used to obtain the deposit. The fibrous network 1 can then be transferred to a secondary substrate 3.

EXAMPLES

SWCNTs (single walled carbon nanotubes) were synthesized in an aerosol laminar flow (floating catalyst) reactor using carbon monoxide and ferrocene as a carbon source and a catalyst precursor, respectively. SWCNT mats were then collected directly from the gas phase downstream of the reactor by filtering through 2.45 cm diameter nitrocellulose (or silver) disk filters (Millipore Corp, USA). In the following examples the filter takes the role of the preliminary substrate 2 though other means of obtaining the network of fibrous material 1 on the preliminary substrate 2 are possible according to the invention.

Figure 7A:
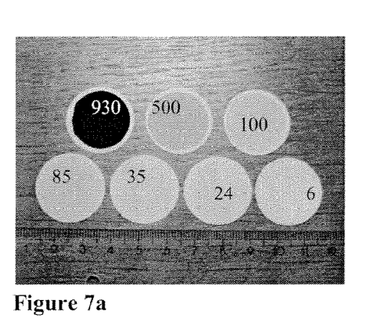
FIG. 7a presents an image of SWCNT mats collected on nitrocellulose filters (the numbers show the thickness value in nm)

The deposition temperature on the filter surface (preliminary substrate) was measured to be 45° C. The layer thickness of SWCNT mats was controlled by the deposition time, which could be altered from a few minutes to several hours depending on the desired network thickness. Mats of different thicknesses are shown in FIG. 7a. Mats collected on filters were randomly oriented networks of SWCNTs as illustrated by the SEM images of FIGS. 8a, 8b, 8c, 8d.

The layer thickness of nanotube mats was measured with a scanning electron microscope (SEM) or an atomic force microscope (AFM) depending on the network thickness. Eight cross sections of CNT network samples at different network positions (three in the center and five at the edges) were measured and averaged. Those mats with thicknesses below 50 nm were measured with the AFM technique.

Figure 7B:
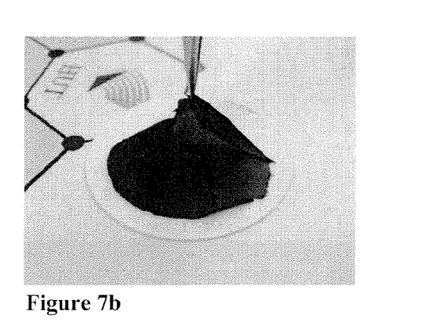
FIG. 7b presents an image showing how a 1 μm thick mat can be easily removed from a nitrocellulose filter.
Figure 8A:
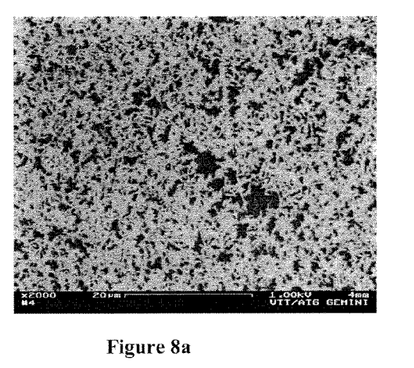
FIG. 8a presents a network having monolayer thickness after densification with ethanol.
Figure 8B:
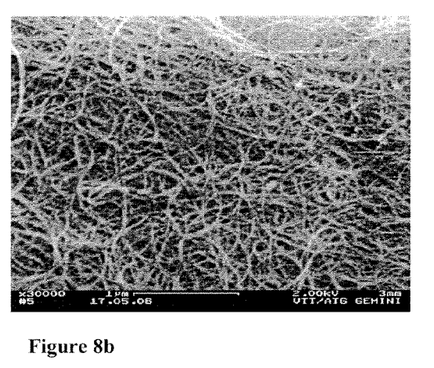
FIG. 8b presents a 500 nm thick layer after densification with ethanol.
Figure 8C:
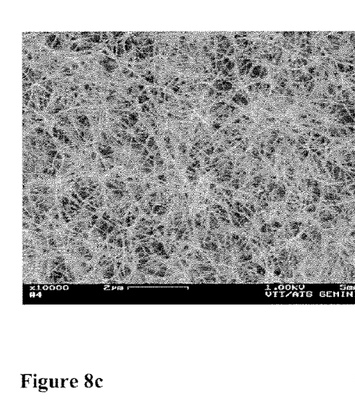
FIG. 8c presents a 300 nm thick layer before densification with ethanol.
Figure 8D:
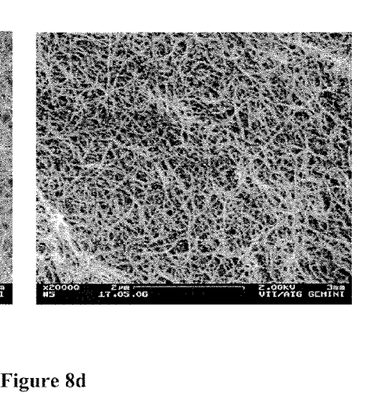
FIG. 8d presents the 300 nm layer after densification with ethanol.

It is worth noting that CNT mats thicker than 1 μm could be easily maneuvered by removing the mat from the filter by simply lifting the mat mechanically, as shown in FIG. 7b and later transferring it to a secondary substrate 3. However, thinner layers tended to be insufficiently robust to remain intact when being similarly removed from the supporting substrate and, as a result, could not be easily transferred. In this circumstance one embodiment of the present invention based on physical compression and heating (thermo-compression) can be used to transfer the mats. Thermo-compression may be achieved by, e.g., applying a force between two parallel plates wherein the preliminary 2 and the secondary 3 substrates are placed between the parallel plates. In this case the fibrous mat is located between the preliminary 2 and the secondary 3 substrate and one or more of the parallel plates are heated.

Example 1

In this example, SWCNT mats are transferred to 10 μm thick medium-density polyethylene (PE) polymer films (Metsä Tissue Ltd, Finland). This material was chosen because of its suitable flexibility, optical transparency, melting temperature ($t_m$=125° C.) and glass transition temperature ($t_g$=125° C.)

Figure 13:
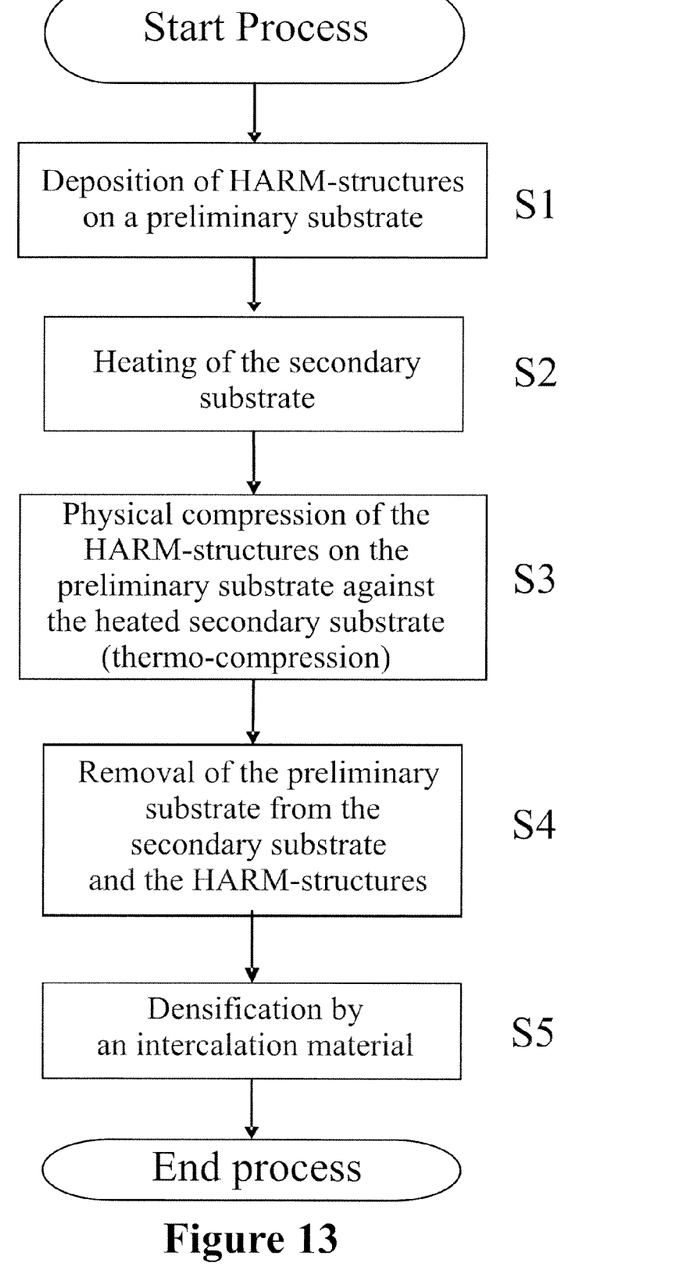

For the transfer and integration of CNT mats into PE films, the following procedure was performed (with references to FIG. 13). The HARM-structures (CNTs in this case) were first deposited on the preliminary substrate 2 (step S1). Before the thermo-compression step (S3) used to transfer the CNTs from the preliminary substrate 2 to the secondary substrate 3, the secondary substrate 3 was heated (step S2). After thermo-compression the preliminary substrate 2 was removed from contact with the CNTs and the secondary substrate 3 (step S4). Finally, the transferred network 1 of CNTs was densified on the secondary substrate 3 by an intercalation material (ethanol) in step S5.

In this example, the filter acted as the preliminary substrate 2, the PE film acted as the secondary substrate 3, the differential in adhesive van der Waals force was used to transfer the film from the preliminary 2 to the secondary 3 substrate, and heating via conduction, physical compression and densification by an intercalation material (ethanol) were used to modify the CNT network 1. During and as a result of the heating, the substrate material of the secondary substrate 3 also acted as an intercalation and a matrix material.

The PE film was placed on a heating plate and heated to its thermal treatment temperature of 100° C. at a rate of 5-6° C./min. Then, the filter coated with a CNT network was placed in close proximity to the PE film and a force was applied to press it against the heated PE film with a pressure of 0.35 N/cm² for 5-10 s. Pressure and heating caused the fibrous material to become imbedded in the PE film. After removing the filter from the PE film, CNT mats were found to be successfully transferred. Double sided lamination of CNT mats between PE films was also performed as well as laminating several layers of PE films with CNT mats in series.

Figure 9A:
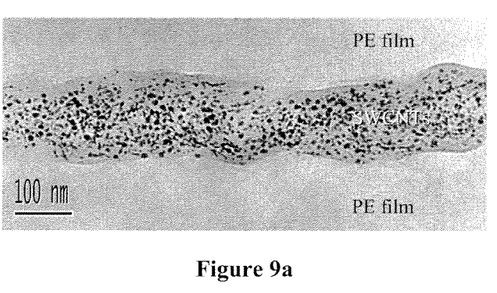

FIGS. 8a, 8b, 8c and 8d show the effects of densification with ethanol. FIG. 9a presents a transmission electron microscope (TEM) image of the sandwich structure of a 150 nm thick CNT network laminated between PE films. For the TEM observation, a 50 nm thick cross-section of the film was prepared. The dark spots represent catalyst particles in the projection through the 50 nm layer. As one can see the network structure appears uniform and homogeneous.

Figure 9B:
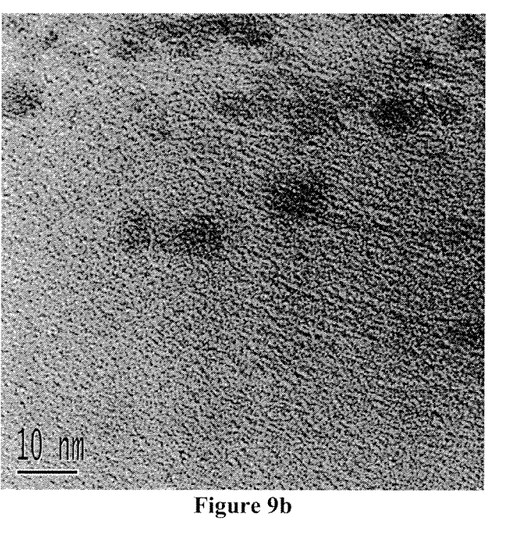
FIG. 9b shows a close-up of a boundary region between the SWNT film and a PE film.

FIG. 9b presents a close-up of the transition region between the PE film and the CNT mat, where a good mixing between CNTs and PE in the boundary layer can be observed. This mixing provides strong bonding between the layers.

For optical transparency investigations, an uncoated polymer film was used as a reference. The transparency of the CNT mats integrated into PE films varied respectively from approximately 60 to 95% for CNT network thickness ranging from 500 to 24 nm.

Figure 10A:
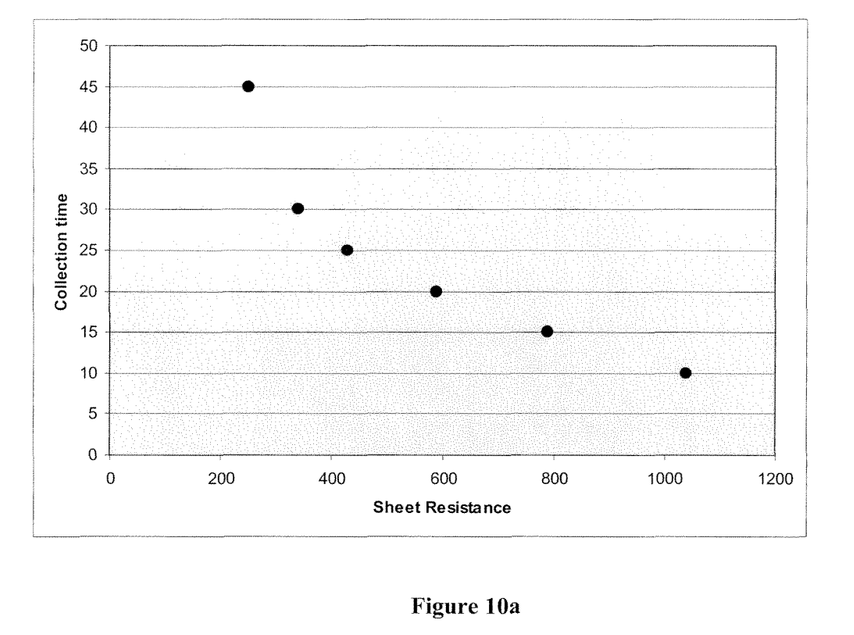
FIG. 10a shows measurement data for the sheet resistance (ohm/square) for CNT mats as a function of collection time (i.e. thickness) of CNTs on a substrate.

Since the as deposited CNT mats have low density and, as a result, individual CNTs have on the average a weak electrical contact between tubes, prior to the measurements of the electrical properties, the mats of CNTs were modified (compacted or desified) by adding a droplet of ethanol to the transferred layer. FIGS. 8a, 8b, 8c and 8d show SEM images of the densified and undensified layers of varying thickness and the effects of densification on the network properties. In general, the densification of the CNT mats led to a significant increase in electrical conductivity. For the electrical conductivity measurements, CNT network-on-PE-samples were measured with a ring probe. After drying from ethanol, the resistance decreased to between 2 and 8 times lower than the original value before densification (Table 3). This significant decrease in resistance is likely explained by the CNT film densification and the improvement of the percolation between CNTs. Additional treatment with nitric acid further reduced the sheet resistance. FIG. 10a graphically presents the data of Table 3 after treatment with nitric acid.

TABLE 3

Effect on sheet resistance (Ohm/square) of densifying CNT mats of different thicknesses with ethanol and functionalization with nitric acid.

| Rs (pristine sample) | Rs (densified with ethanol) | Rs (Nitric Acid) | Deposition Time |
| --- | --- | --- | --- |
| 2600 | 1250 | 250 | 45 min |
| 8700 | 1600 | 340 | 30 min |
| 8800 | 1700 | 430 | 25 min |
| 8900 | 2700 | 590 | 20 min |
| 12000 | 6700 | 790 | 15 min |
| 21000 | 7500 | 1040 | 10 min |

Figure 10B:
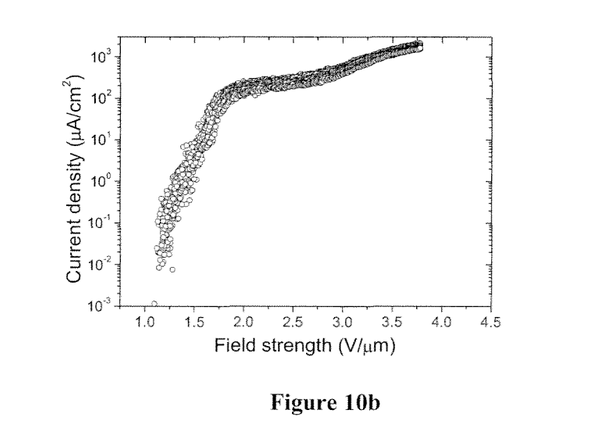
FIG. 10b shows measured field emission characteristics of CNT mats by presenting current density against the electric field strength.

Since one of the potential applications of SWCNTs is devices based on cold electron field emission, we carried out measurements to demonstrate the applicability of the SWCNT-PE film structure for such purposes. FIG. 10b shows the dependence of the current density against the electric field strength obtained during 10 measurement scans. As one can see the SWCNT-PE film structure exhibits a low field threshold of about 1.3 V/μm. Another advantage of the film is the presence of a clear current plateau, which is valuable for, for instance, flat screen displays, since the variation of the electric field between 2 and 3 V/μm does not lead to a significant change in the electron emission. Consequently, more variation is allowable in the component manufacturing process.

Figure 11:
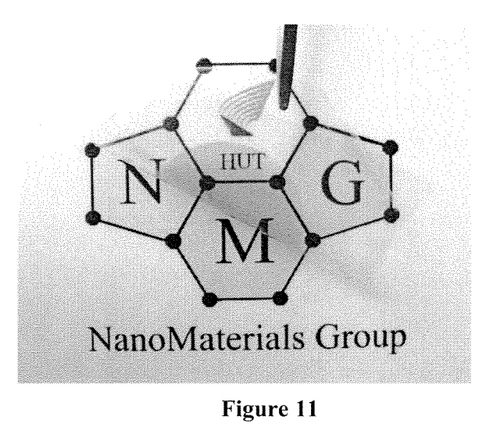
FIG. 11 is an illustration of flexibility and transparency of a PE-SWCNT film structure produced according to a method according to one embodiment of the present invention.

Another very important and useful property of the CNT-PE film structure produced with a method according to an embodiment of the present invention is its mechanical flexibility. The CNT-PE film structures were found to be bendable and could be repeatedly rolled and unrolled while retaining their transparency, conductivity and field emission properties. FIG. 11 is an image of a bent CNT-PE structure.

Example 2

Figure 12A:
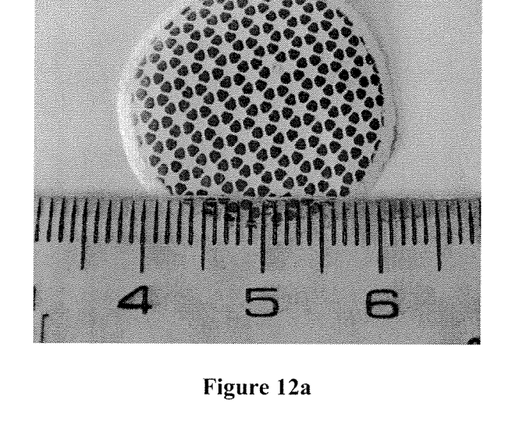
FIGS. 12a and 12b are an illustration of flexibility and transparency of a patterned PE-SWCNT film structure produced according to a method according to one embodiment of the present invention and FIG. 13 is a flow-chart illustration of a method corresponding to example 1, according to one embodiment of the present invention.
Figure 12B:
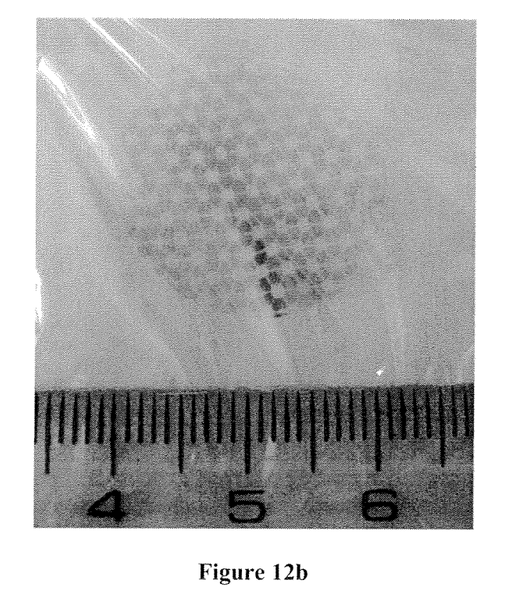

FIG. 12 shows a patterned preliminary substrate 2 (FIG. 12a) and the corresponding patterned secondary substrate 3

(FIG. 12b) produced according to the method described above and presented schematically in FIG. 5, in which the HARM-structures are filtered through a preliminary substrate of variable porosity. Other steps in the process are as in Example 1.

Example 3

Films were produced according to the embodiment of the invention schematically presented in FIG. 6. In this example iron particles of approximately 2 nanometers in diameter were co-deposited on a filter substrate 2 together with the CNTs. The CNTs were produced as in Example 1, however, at the end of the deposition cycle, reactor conditions where changed such that CNTs did not nucleate to the iron catalyst particles 9. This was achieved by increasing the concentration of $CO_2$ in the reactor. Other means for preventing nucleation of the CNTs to the catalyst particles are also possible. For instance, lowering the furnace temperature or removing the flow of carbon source gases may be used. Thus the iron particles 9 could be transported to the filter without attached CNTs, and deposited on the previously deposited network. A transparency of 59% and a conductivity of 10 ohm/square were achieved by this method.

Example 4

In this example, the CNTs were produced and transferred to a secondary substrate 3 essentially as in Example 1 whose process flow is illustrated by the flow-chart of FIG. 13. In this Example 4 the CNTs were synthesized at 900 C and the CNTs were again collected on nitrocellulose filters. These filters were then pressed onto PE substrates, which were this time held at room temperature (see step S2 and step S3 of FIG. 13). It was observed that the film thickness was dependent on the collection time of the CNTs on the nitrocellulose filters.

As is clear for a person skilled in the art, the invention is not limited to the examples described above but the embodiments can freely vary within the scope of the claims.

The invention claimed is:

1. A method for the production of a patterned fibrous network-substrate component, wherein said method comprises the steps of:
   a) providing a patterned network of fibrous material (1) on a preliminary substrate (2) by depositing high aspect ratio molecular structures (HARM-structures) being in a gas flow onto the preliminary substrate (2) by
      i) passing the HARM-structures through a filter overlaid with a pattern or grid, or
      ii) a lift-off process, or
      iii) passing a suspension of the HARM-structures through a filter having an embedded pattern,
      the HARM-structures being selected from the group consisting of nanotubes, carbon nanotubes, fullerene functionalized carbon nanotubes, carbon nanobuds, boron-nitride nanotubes, carbon containing nanorods, phosphorous containing nanorods, boron containing nanorods, nitrogen containing nanorods and silicon containing nanorods;
   b) placing the patterned network of fibrous material (1) on the preliminary substrate (2) in proximity to a secondary substrate (3);
   c) applying a force to the patterned network of fibrous material (1) to attract the patterned network of fibrous material (1) from the preliminary substrate (2) to the secondary substrate (3) in order to transfer the patterned network of fibrous material (1) from the preliminary substrate (2) to the secondary substrate (3); and
   d) removing the preliminary substrate (2) from the patterned network of fibrous material (1).

2. The method according to claim 1, further comprising:
depositing the fibrous material in the gas flow on the preliminary substrate by magnetic, mechanical, thermophoretic, photophoretic, electrophoretic, gravitational and/or inertial transport.

3. The method according to claim 1, wherein the applied force is provided by a differential in adhesive forces between the network of fibrous material (1) and the preliminary substrate (2) and the network of fibrous material (1) and the secondary substrate (3).

4. The method according to claim 3, wherein the differential in adhesive forces between the network of fibrous material (1) and the preliminary substrate (2) and the network of fibrous material (1) and the secondary substrate (3) is in whole or in part provided by at least one of a differential in electrical, electrostatic, van der Waals or capillary forces or by a differential in surface tension.

5. The method according to claim 3, wherein the differential in adhesive force between the network of fibrous material (1) and the preliminary substrate (2) and the network of fibrous material (1) and the secondary substrate (3) is in whole or in part provided by a matrix, an intercalation or a suspension material, which is in contact with the network of fibrous material on the preliminary substrate, and which is attracted to the secondary substrate (3) and transports the network of fibrous material (1) together with the matrix, intercalation or suspension material from the preliminary substrate (2) to the secondary substrate (3).

6. The method according to claim 3, wherein the differential in adhesive force between the network of fibrous material (1) and the preliminary substrate (2) and the network of fibrous material (1) and the secondary substrate (3) is in whole or in part provided by applying and/or removing energy to or from one or more of the network of fibrous material (1), the preliminary substrate (2) and the secondary substrate (3) so that the network of fibrous material (1) is attracted to the secondary substrate (3).

7. The method according to claim 1, further comprising:
modifying the network of fibrous material (1) by physical compression, by the application and/or removal of heat and/or energy, by the application of a matrix, intercalation, suspension, adhesive and/or junction creating material and/or by application of a force field.

8. The method according to claim 1, further comprising:
applying heat or energy to the network of fibrous material (1) and/or the preliminary substrate (2) by laser, electrical, resistive, conductive, radiative, acoustic and/or vibrational heating, inductive heating, combustion and/or chemical reaction, and/or nuclear reaction.

9. The method according to claim 7, wherein the modifying force field is thermophoretic, inertial, electrical, magnetic, photophoretic, acoustic and/or gravitational.

10. The method according to claim 7, wherein the junction creating material is a metal particle or a bridging molecule.

11. The method according to claim 1 wherein steps (a) to (d) are performed continuously for continuous production of one or more fibrous network-substrate components.

12. The method according to claim 1, wherein any or all of steps (a) to (d) are performed intermittently for batch production of one or more fibrous network-substrate components.

13. The method according to claim 1, wherein steps (a) to (d) are repeated in parallel and/or in series in order to form one or more multilayered fibrous network-substrate components.

14. The method according to claim 1, wherein steps (a) to (d) are repeated two or more times for the same secondary substrate.

15. The method according to claim 1, wherein the preliminary substrate is formed from nitrocellulose, polyvinylidene fluoride, polyethylene, polytetrafluoroethylene, glass fiber, or silver.

16. The method according to claim 1, wherein the secondary substrate is formed from glass, silicon or polyethylene.

17. The method according to claim 1, wherein the lift-off process includes:
- depositing an additive layer of a soluble or otherwise removable material on the preliminary substrate;
- exposing the soluble or otherwise removable material to patterned radiation;
- washing with a solvent to remove exposed portions of the additive layer;
- depositing the HARM-structures on the remaining additive layer and newly exposed portions of the preliminary substrate; and further washing with the solvent to remove the remaining additive layer.

18. The method according to claim 1, wherein the embedded pattern is defined by regions of high and low porosity.

19. A method for the production of a patterned fibrous network-substrate component, wherein said method comprises the steps of:

a) providing a patterned network of fibrous material (1) on a preliminary substrate (2) by depositing high aspect ratio molecular structures (HARM-structures) being in a gas flow onto the preliminary substrate (2) by
  i) passing the HARM-structures through a filter overlaid with a pattern or grid, or
  ii) passing a suspension of the HARM-structures through a filter having an embedded pattern,
  the HARM-structures being selected from the group consisting of nanotubes, carbon nanotubes, fullerene functionalized carbon nanotubes, carbon nanobuds, boron-nitride nanotubes, carbon containing nanorods, phosphorous containing nanorods, boron containing nanorods, nitrogen containing nanorods and silicon containing nanorods;

b) placing the patterned network of fibrous material (1) on the preliminary substrate (2) in proximity to a secondary substrate (3);

c) applying a force to the patterned network of fibrous material (1) to attract the patterned network of fibrous material (1) from the preliminary substrate (2) to the secondary substrate (3) in order to transfer the patterned network of fibrous material (1) from the preliminary substrate (2) to the secondary substrate (3); and d) removing the preliminary substrate (2) from the patterned network of fibrous material (1).

\* \* \* \* \*